United States Patent [19]

Gnade et al.

[11] Patent Number: 5,487,031

[45] Date of Patent: Jan. 23, 1996

[54] THREE-DIMENSIONAL FERROELECTRIC INTEGRATED CIRCUIT HAVING INSULATION LAYER BETWEEN MEMORY LAYERS

[75] Inventors: Bruce E. Gnade, Rowlett; Russell F. Pinizzotto, Dallas; Christopher L. Littler, Denton, all of Tex.

[73] Assignee: Texas Instruments Incorporated, Dallas, Tex.

[21] Appl. No.: 311,806

[22] Filed: Sep. 26, 1994

Related U.S. Application Data

[63] Continuation of Ser. No. 954,211, Sep. 30, 1992, Pat. No. 5,375,085.

[51] Int. Cl.[6] ............................................. G11C 11/22
[52] U.S. Cl. ................................... 365/145; 365/45
[58] Field of Search ......................... 365/145, 45; 257/295

[56] References Cited

U.S. PATENT DOCUMENTS 4,149,302 4/1979 Cook ........................................ 29/25.42
4,707,897 11/1987 Rohrer et al. ........................... 29/25.42

*Primary Examiner*—David C. Nelms
*Assistant Examiner*—Andrew Q. Tran
*Attorney, Agent, or Firm*—Bret J. Petersen; James C. Kesterson; Richard L. Donaldson

[57] ABSTRACT

A ferroelectric integrated circuit is provided in which a first layer of conducting lines (14) is formed over an insulating base layer (10). A first ferroelectric layer (16) is formed overlying the first layer of conducting lines (14). A second layer of conducting lines (18) is formed overlying the first ferroelectric layer (16) with each of the conducting lines of the second layer of conducting lines (18) being substantially perpendicular to the conducting lines of the first layer of conducting lines (14). Potentials placed on selected conducting lines in the first and second layers of conducting lines (14 and 18) polarize areas of the first ferroelectric layer (16) between intersections of the selected conducting lines. Multiple layers may be stacked to form a three-dimensional ferroelectric integrated circuit.

11 Claims, 3 Drawing Sheets

THREE-DIMENSIONAL FERROELECTRIC INTEGRATED CIRCUIT HAVING INSULATION LAYER BETWEEN MEMORY LAYERS

This is a continuation of application Ser. No.07/954,211, filed Sep. 30 1992, now U.S. Pat. No. 5,375.085.

TECHNICAL FIELD OF THE INVENTION

This invention relates generally to electronic circuits, and more particularly to a three-dimensional ferroelectrical integrated circuit and method of fabricating the same.

BACKGROUND OF THE INVENTION

Random access memories, or RAMs, have become a basic building block of integrated electronics systems. For many applications, maximization of memory density is extremely important, for example, where power or space constraints are significant. Thus, an ever pressing need exists to increase RAM density.

Theoretically, the density of random access memories could be increased by building layers of memory cells on top of other layers of memory cells to form a three-dimensional (3-D) RAM. However, in conventional integrated circuit processing technology for random access memories, such as that using silicon or gallium arsenide technology, the memory cells consist of transistors which act as switches for current flow to charge-storing capacitors. In fabrication of such transistors, the doping profiles, damage removal, and conducting film deposition are usually performed at high temperatures which result in diffusion of dopants. Thus, the fabrication of a second layer of memory cells over a first layer would irreversibly damage the first layer. Furthermore, a third layer would damage both the first and second layers.

Moreover, the advent of advanced processing systems, such as those based on neural networks, smart memories, or fuzzy logic, has brought about the need to increase the functionality of memory chips. For example, for existing implementations of model neurons, a major unresolved problem is that of achieving a simple integration scheme containing a large number of weighted inputs converging on a single neuron-like element. This problem can be solved in part with random access memories which allow for cross talk between memory locations. Existing RAMs do not provide solutions for this or related problems.

Therefore, a need has arisen for an integrated circuit with increased memory density by allowing for 3-D structures. Furthermore, a need has arisen for an integrated circuit that allows for cross talk between memory locations for applications in advanced processing systems.

SUMMARY OF THE INVENTION

In accordance with the teachings of the present invention, a ferroelectric integrated circuit is provided which substantially eliminates or reduces disadvantages and problems associated with prior art devices. In particular, an insulating base layer is provided over which a first layer of conducting lines is formed. A first ferroelectric layer is then provided overlying the first layer of conducting lines. A second layer of conducting lines is formed over the first ferroelectric layer, with each of the conducting lines of the second layer of conducting lines being substantially perpendicular to the conducting lines of the first layer of conducting lines. Potentials placed on selected conducting lines in the first and second layers of conducting lines polarize areas of the first ferroelectric layer between intersections of the selected conducting lines.

In another embodiment of the present invention, a plurality of layers of memory cells as described above are stacked on top of each other so as to provide a three-dimensional ferroelectric integrated circuit.

An important technical advantage of the present invention is the fact that greatly improved density in random access memory circuits may be achieved because of the ability to stack layers of memory cells atop other layers of memory cells so as to form a three-dimensional random access memory.

Another technical advantage of the present invention is the fact that dipole to dipole interaction between memory cells of the ferroelectric integrated circuit of the present invention may be controlled for use in advanced processing systems, such as neural networks.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The preferred embodiments of the present invention are illustrated in FIGS. 1 through 7 of the drawings, like numerals being used to refer to like and corresponding parts of the various drawings.

The present invention involves fabrication of a ferroelectric integrated circuit ("FEIC") and a three dimensional ferroelectric integrated circuit device ("3-D FEIC") using successive deposition of conducting and ferroelectric thin films. Such devices operate by defining ferroelectric domains between the conducting layers. Applications for such FEICs include random access memory systems and advanced processing systems, as will be discussed below.

Figure 1A:
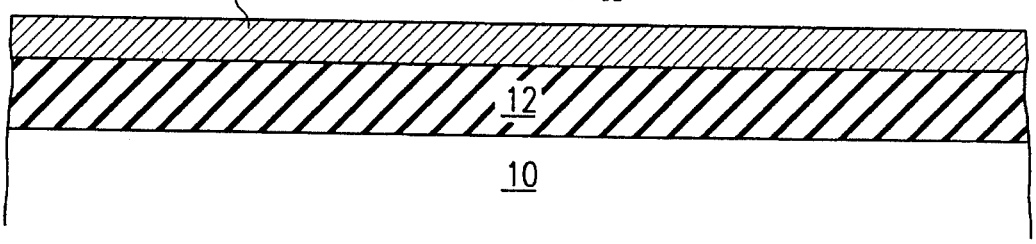
FIGS. 1a and 1b illustrate a first memory cell layer of a three-dimensional ferroelectric integrated circuit constructed according to the teachings of the present invention.
Figure 1B:
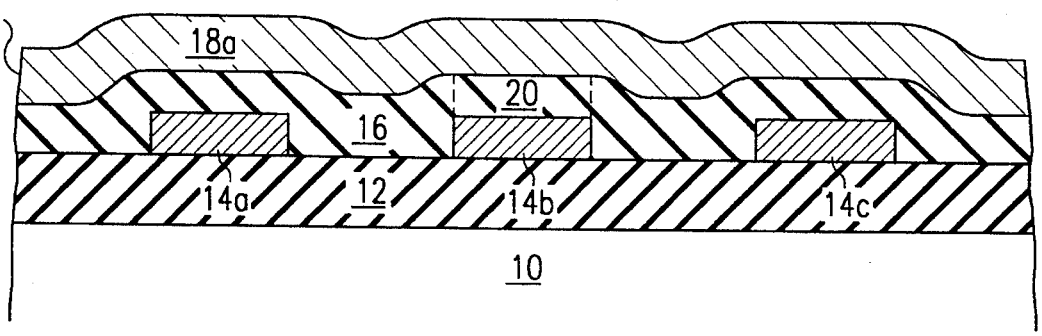

FIGS. 1a and 1b are schematic representations of a first memory cell layer of a FEIC constructed according to the teachings of the present invention. As shown, a substrate 10 is provided over which a dielectric film 12 is formed as an insulating layer. Substrate layer 10 may be a semiconductor material such as silicon or gallium arsenide, for example, if read/write sensing circuitry for accessing the memory cells is to be integrated into the same device. Substrate layer 10 may also comprise a ferroelectric material if epitaxial overlayers are desired. Dielectric layer 12 may be omitted if this substrate layer 10 is an insulating material.

Figure 2:
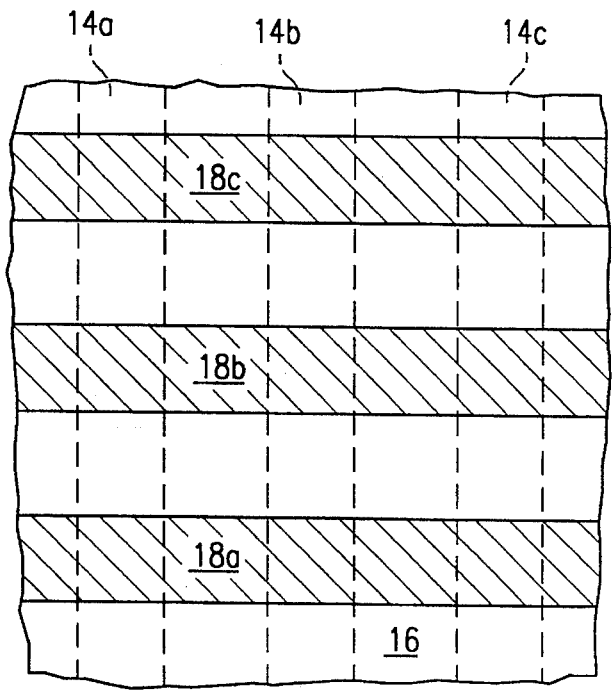
FIG. 2 illustrates conducting layers of a memory cell layer constructed according to the teachings of the present invention.

As shown in FIG. 1a, a first conducting layer 14 is formed over dielectric layer 12. As shown in FIG. 1b and FIG. 2, conducting layer 14 is patterned into a series of substantially parallel conducting lines 14a, 14b, and 14c using standard lithographic and etching processes. It should be understood that only three conducting lines are shown for clarity, and many other conducting lines can be formed.

Referring now to FIG. 1b, a thin ferroelectric layer 16 is deposited over the entire assembly. Any ferroelectric material may be used, including, but not limited to, $KNO_3$, $BaTiO_3$, TGS, PZT, $LiNbO_3$, and SbSI. A second conducting layer 18 is deposited over ferroelectric layer 16. Conducting layer 18 is patterned using standard lithographic and etching processes to form substantially parallel conducting lines that are substantially perpendicular to those formed from conducting layer 14. FIG. 2 illustrates three conducting lines each formed out of conducting layers 14 and 18. In particular, FIG. 2 illustrates three conducting lines 14a, 14b, and 14c from conducting layer 14, and three conducting lines 18a, 18b, and 18c formed from conducting layer 18. As is shown in FIG. 2, these conducting lines are substantially perpendicular. Only three conducting lines out of each conducting layer are shown for clarity. The cross-over or intersection points of the lines formed in conducting layers 14 and 18 define capacitor cells with areas equal to the width of each conducting line formed out of conducting layer 14 times the width of each conducting line formed out of layer 18. A representative capacitor cell 20 is shown in FIG. 1b formed between conducting line 18a of conducting layer 18 and conducting line 14b of conducting layer 14.

The dielectric of the capacitor is the ferroelectric material of ferroelectric layer 16. The thickness of this capacitor cell is the thickness of the ferroelectric layer 16. The thickness of the ferroelectric layer 16 may be on the order of a few hundred angstroms to a few microns. The thickness of the conducting layers may be in order of a few thousand angstroms.

Each of the capacitors formed between conducting layers 14 and 18 forms a memory cell. Each cell is addressed by one conducting line of conducting layer 14 and one conducting line of conducting layer 18. The cells operate because of the remnant polarization of the ferroelectric material which forms ferroelectric layer 16. By biasing the appropriate conducting lines, conducting lines 18a and 14b, an electric field is generated within memory cell 20. If the electric field is greater than the critical electric field, $E_c$, needed to align the ferroelectric domains of memory cell 20, then the entire capacitor will become polarized in the "up" orientation (using the usual convention that the electric field lines point in the direction that a positive charge would move). To accomplish this, conducting line 14b would be charged positively and conducting line 18a would be charged negatively. If the potential is reversed so that the electric field now exceeds $-E_c$, then this domain will reverse its orientation to the "down" orientation. These two orientations can represent the binary states of "1" and "0". The capacitance that is read by sensing circuitry, to be discussed, is different in the two cases since the remnant polarization has opposite signs.

Figure 3:
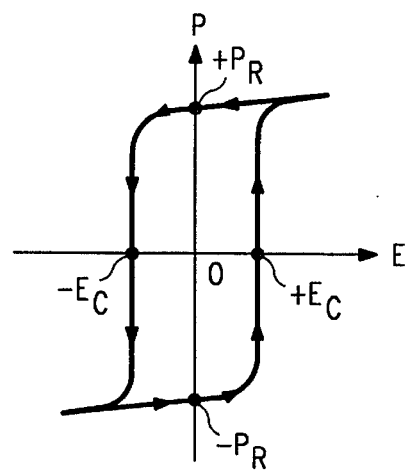
FIG. 3 illustrates a typical hysteresis loop for a ferroelectric material.

FIG. 3 shows a typical hysteresis loop for a ferroelectric material. Shown is a plot of the polarization, P, of the ferroelectric material versus the electric field, E. The polarization value depends on the direction of the last change of the electric field. As E increases to large positive values, the polarization abruptly increases to a large positive value. As E is decreased to large negative values, the polarization remains essentially the same until $-E_c$ is reached whereupon the polarization changes to a large negative value. This is maintained as E increases until $+E_c$ is exceeded. The value of the polarization travels around the loop in the direction shown in FIG. 3. The capacitance of each memory cell depends on the sign of the polarization since the dielectric constant of the ferroelectric layer 16 is the sum of the linear dielectric constant of the material and its polarization, as expressed by the following equation $$\epsilon = \epsilon_o + P/E,$$

wherein $\epsilon$ is the dielectric permittivity, $e_o$ is the dielectric permittivity of free space, P is the polarization, and E is the electric field. Thus, the capacitance of each cell will change depending on the polarization. As shown in FIG. 3, the polarization will be equal to a $+P_r$ or a $-P_r$ during read cycles, i.e., when the electric field would equal zero. Because of these principles, each memory cell can be independently programmed and read.

Typical switching voltages for memory cells within FEICs according to the present invention are in the range of 5 to 10 volts. Furthermore, the typical capacitance encountered with the present invention are on the order of 50 femtofarads per square micron.

The ferroelectric layers may be deposited using many methods, including but not limited to, co/evaporation, D.C. sputtering, R.F. diode sputtering, sol-gel methods, molecular beam epitaxy, spinning, laser evaporation, E-beam evaporation, pyrolysis, metallo-organic deposition CVD, liquid phase epitaxy, and gas phase epitaxy. The conducting layers may be similarly formed.

Figure 4:
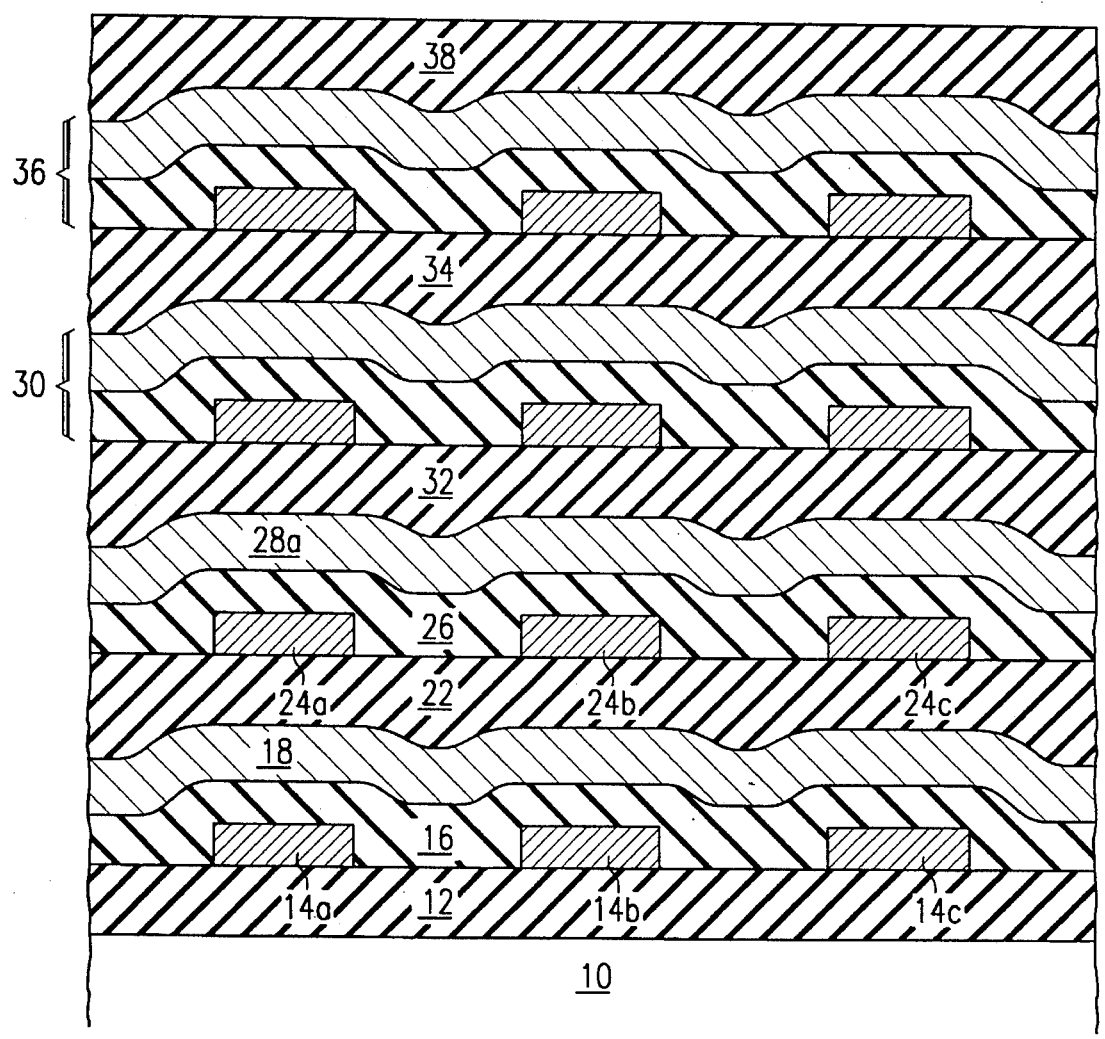
FIG. 4 illustrates multiple memory cell layers of a three-dimensional ferroelectric integrated circuit constructed with inter-layer isolation according to the teachings of the present invention.

FEICs, according to the present invention allow for great increases in density over existing memory cells because of their ability to be formed in three-dimensional arrays. FIG. 4 illustrates one embodiment of a three-dimensional ferroelectric integrated circuit constructed according to the present invention. In particular, FIG. 4 illustrates a 3-D FEIC in which each two-dimensional layer of memory cells is separated from the next layer by an inter-layer isolation layer.

As shown in FIG. 4, the structure shown in FIG. 1b is repeated, including layers 10 through 18. Next, an inter-layer isolation layer 22 is deposited over conducting layer 18 after conducting layer 18 has been patterned and etched to form conducting lines. Isolation layer 22 allows for electrical isolation between layers of memory cells. Above isolation layer 22, a conducting layer is formed and then patterned and etched to form conducting lines 24a, 24b, and 24c. It should be understood that only three conducting lines have been shown throughout this discussion for clarity, and many other conducting lines may be formed in each conducting layer.

A second ferroelectric layer 26 is formed over the conducting lines 24a, 24b, and 24c. Above ferroelectric layer 26, a conducting layer 28 is formed. Conducting layer 28 is patterned and etched to form a plurality of conducting lines, with conducting line 28a being shown in FIG. 4. This process is continued to form other layers of the 3-D FEIC. Each layer is isolated by an inter-layers isolation layer interleaved between each memory cell layer. As shown in FIG. 4, memory cell layer 30, comprising conducting lines and a ferroelectric layer, is formed between inter-layer isolation layers 32 and 34. Furthermore, memory cell layer 36 is formed between isolation layers 34 and 38.

Figure 5:
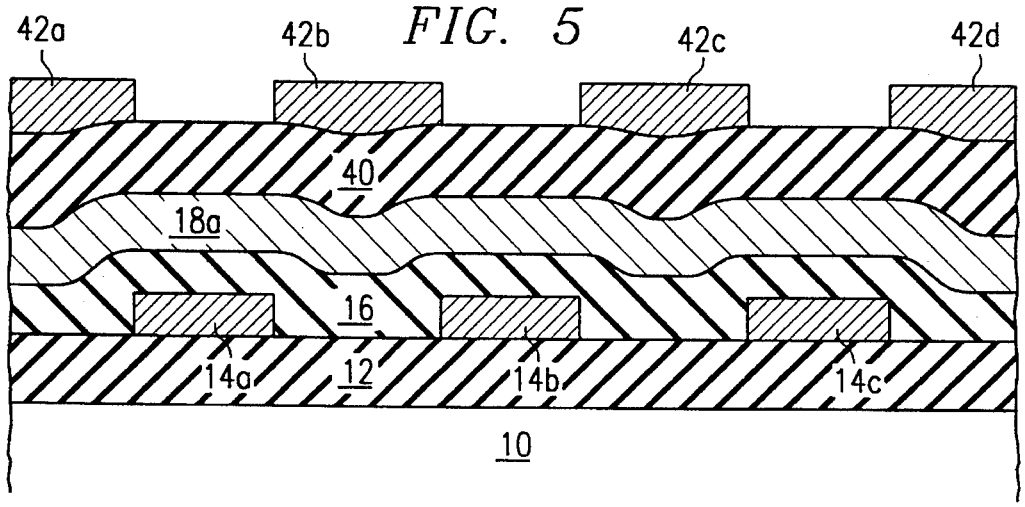
FIG. 5 illustrates two memory cell layers of a three-dimensional ferroelectric integrated circuit constructed without inter-layer isolation according to the teachings of the present invention.

FIG. 5 illustrates an alternate embodiment of the present invention, in which a three-dimensional FEIC is constructed without inter-layer isolation. In particular, the memory cell layer shown in FIG. 1b is repeated, including layers 10 through 18. After layer 18 has been etched and patterned to form conducting lines, a second ferroelectric layer 40 is formed above the conducting lines formed out of conducting layer 18. Above ferroelectric layer 40, a conducting layer 42 is deposited. Conducting layer 42 is patterned and etched to form conducting lines 42a, 42b, 42c, and 42d. The storage cells in the first layer of memory cells are defined as discussed above in connection with FIG. 1b. The memory cells of the second conducting layer, which comprises the conducting lines formed out of conducting layer 18, ferroelectric layer 40, and conducting lines 42a through 42d, are defined by the intersections of the conducting lines formed in conducting layer 18 and those formed in conducting layer 42. These cells are addressed by an electric field imparted to the conducting lines of conducting layer 18 and those of conducting layer 42. Because the electric field is between the conducting lines of conducting layers 18 and 42, the storage stage in the ferroelectric devices formed between conducting layers 14 and 18 will not be affected.

Figure 6:
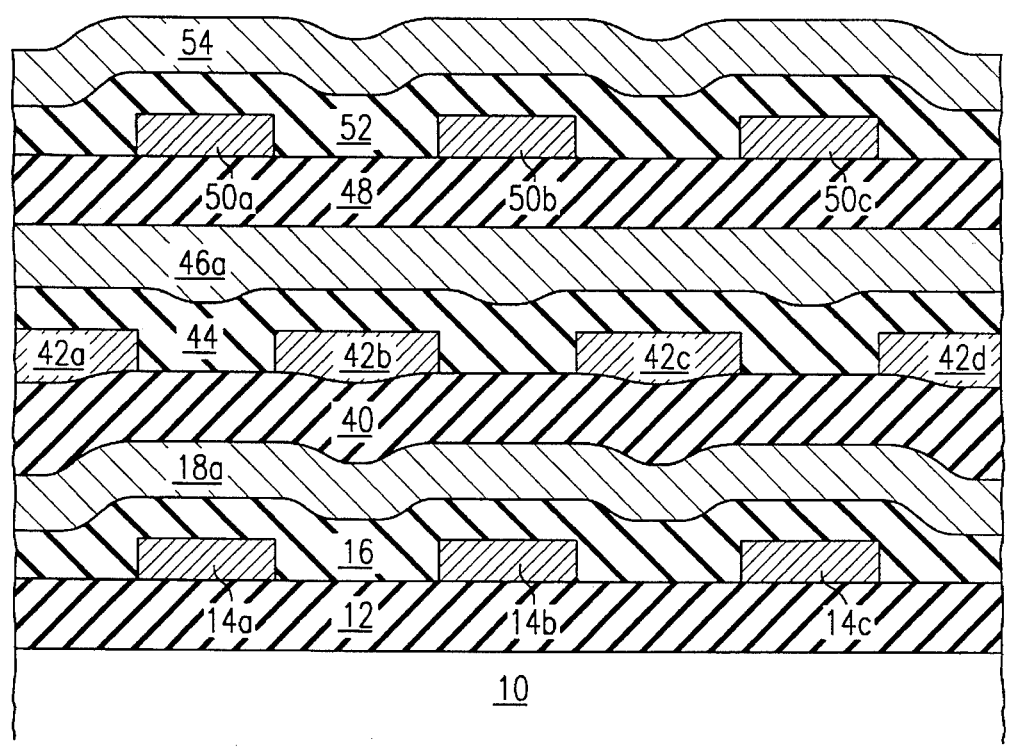
FIG. 6 illustrates multiple memory cell layers of a three-dimensional ferroelectric integrated circuit constructed without inter-layer isolation according to the teachings of the present invention.

FIG. 6 illustrates how the memory cell layers of FIG. 5 may be stacked to form a plurality of memory cell layers for a 3-D FEIC without inter-layer isolation. As shown in FIG. 6, the structure shown in FIG. 5 is repeated, and then another ferroelectric layer 44 is formed over the conducting lines formed out of conducting layer 42. Above ferroelectric layer 44, another conducting layer 46 is formed. Out of this conducting layer 46, a plurality of conducting lines are formed by patterning an etching conducting layer 46. Conducting line 46a is shown in FIG. 6.

Another ferroelectric layer 48 is formed over conducting layer 46, and another conducting layer 50 is formed over ferroelectric layer 48. Conducting layer 50 is then etched and patterned to form conducting lines 50a, 50b, and 50c. Next, if another layer is desired, another ferroelectric layer 52 is laid down over the conducting lines formed out of conducting layer 50. Another conducting layer 54 is then laid down on ferroelectric layer 52, and conducting layer 54 is patterned and etched to form conducting lines. Conducting line 54a is shown in FIG. 6. This process can be continued as many times as desired to form many memory cell layers, with each ferroelectric layer interleaved between successive layers of conducting lines. The areas between the intersections of each adjacent layer of conducting lines form capacitors that form memory cells.

Figure 7:
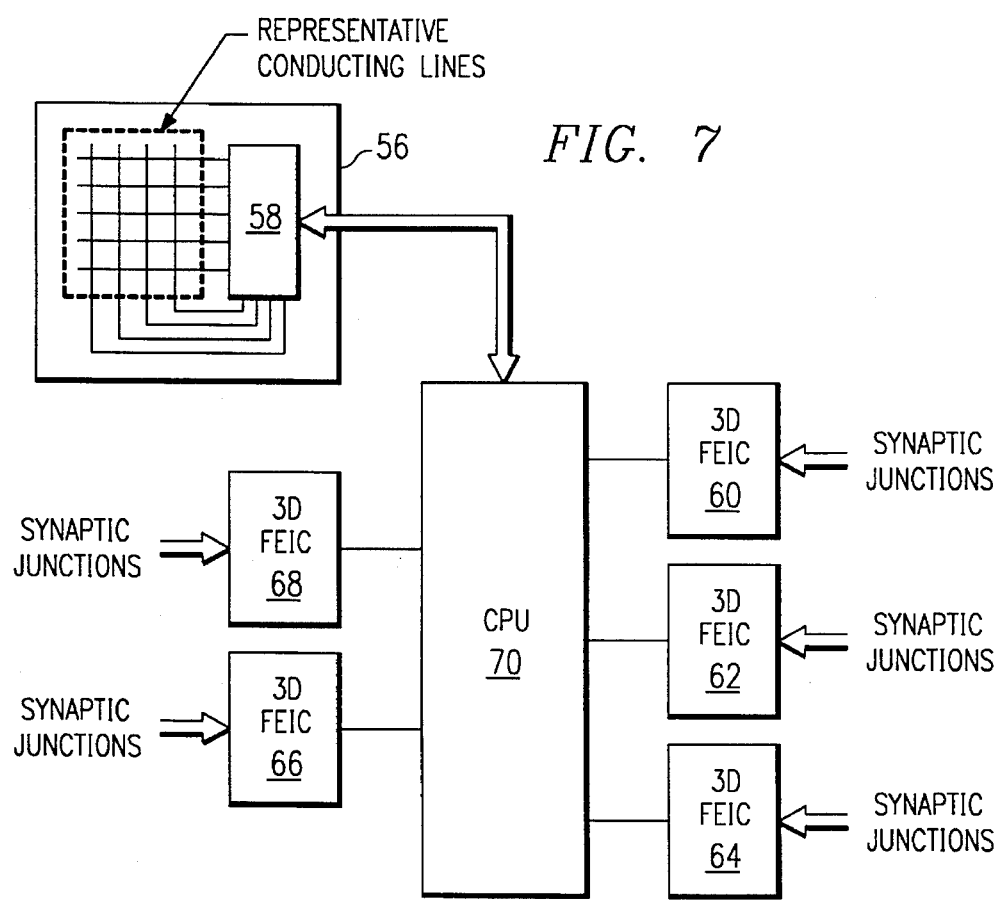
FIG. 7 illustrates a processing system incorporating three-dimensional ferroelectric integrated circuits according to the present invention.

As shown in FIG. 7, the conducting lines of a 3-D FEIC 56 according to the present invention are coupled to read/write circuitry 58. Read/write circuitry 58 is preferably formed in the same integrated circuit as the ferroelectric random access memory 56. For write operations, read/write circuitry 58 places appropriate potentials on the conducting lines forming particular memory cells to polarize those memory cells in particular orientations. For read operations, read/write circuitry 58 senses the capacitance of particular memory cells, and thus reads either a logical "1" or a logical "037 based on the value of that capacitance. For example, the capacitance can be measured by measuring the amount of current needed to put a cell in a particular state. If the cell is already in that state, the current will be low. If the cell is not in the state, the required current will be higher. Such reading is destructive, and thus cells may have to be rewritten if the read operation changed their state. Thus, standard processing applications can be performed by, for example, CPU 70 in connection with FEIC 56. The other FEICs shown in FIG. 7 will be discussed below.

Three-dimensional FEICs constructed according to the present invention provide tremendous advantages over existing memory technologies. Currently envisioned forms of memory up to the 64 mega-bit level are essentially two-dimensional. With this limitation, increases in the size of the memory device must come either by decreasing the size of each memory cell or increasing the chip area. Current predictions for the year 2000 place IC memory sizes somewhere between 500 and 800 $mm^2$ for a 1 G-bit device. In contrast, a 100 layer three-dimensional FEIC constructed according to the teachings of the present invention reduces this to 10 to 20 $mm^2$ with subsequent increases in defect limited yield and profitability.

Furthermore, the applications for three-dimensional ferroelectric memory devices are widespread. Besides having application to conventional processing systems requiring random access to individual memory cells, 3-D FEICS have applications in complex processing systems. For example, three-dimensional FEICs according to the present invention could be used as analog model neurons with high synaptic density, for use in neural network systems, or they could be used in other systems with many parallel inputs and outputs, such as active filter systems. Shown in FIG. 7 is a neural network processing system having as model neurons FEICs 60, 62, 64, 66, and 68, and a central processing unit 70.

As shown in FIG. 7, FEICs 60, 62, 64, 66, and 68 constructed with 3 layers of 100 memory cells each, correspond to neurons addressed by 300 synaptic junctions each and work as non-linear integrators of these synaptic junction signals. By appropriately spacing each of the memory cells within each FEIC, long range dipole to dipole interaction between cells can be used such that when some critical number of cells coupled to the synaptic junctions are polarized in the same manner, the unaddressed cells will likewise become polarized. In effect then, the entire FEIC has switched to a state of uniform polarization which can be sensed by CPU 70. This action is useful in neural network systems.

As another example, by adjusting the size and spacing of the memory cells within FEICs according to the present invention, cross talk between cells, caused by dipole to dipole interaction between cells, can be controlled. For example, with cells located in close proximity to other cells, polarizing one cell can be made to affect other cells around it, whether they be in the same layer or adjacent layers above or below the particular cell addressed. Thus, unaddressed cells in effect integrate the effects of their neighbors on their own states. Such influence corresponds to the requirements of neural network systems, where decisions are made based upon indirect inputs.

Although the present invention has been described in detail, it should be understood that various changes, substitutions, and alterations can be made without departing from the spirit and scope of the invention as defined solely by the appended claims.

What is claimed is:

1. A ferroelectric integrated circuit comprising:
   a base layer;
   a plurality of memory cell layers formed overlying said base layer, each of said plurality of memory cell layers including:

a first layer of conducting lines;

a ferroelectric layer overlying said first layer of conducting lines;

a second layer of conducting lines overlying said ferroelectric layer, wherein each of said conducting lines of said second layer is substantially perpendicular to said conducting lines of said first layer; and a plurality of areas of said ferroelectric layer between intersecting conducting lines in said first and second layers capable of being polarized by potentials placed on said intersecting conducting lines in said first and second layers; and a plurality of inter-layer insulating layers, each of said inter-layer insulating layers interleaved between successive memory cell layers, wherein polarization of a particular area of said plurality of areas in said memory cell layers is capable of causing polarization of other areas proximate to said particular area.

2. The ferroelectric integrated circuit of claim 1, and further comprising read and write circuitry coupled to said ferroelectric integrated circuit for storing and retrieving data from each of said areas of said ferroelectric layer between intersecting conducting lines of each memory cell layer.

3. The ferroelectric integrated circuit of claim 1, wherein said read and write circuitry is operable to retrieve data by sensing capacitances between said intersecting conducting lines of each memory cell layer, and said read and write circuitry is operable to store data within each memory cell layer by polarizing said areas of said ferroelectric layer between intersecting conducting lines.

4. The ferroelectric integrated circuit of claim 2, wherein said read and write circuitry is formed in said ferroelectric integrated circuit.

5. The ferroelectric integrated circuit of claim 1, and further comprising a dielectric layer disposed between said base layer and said plurality of memory cell layers.

6. The ferroelectric integrated circuit of claim 1 wherein said other areas proximate to said particular area are in a single one of said memory cell layers.

7. The ferroelectric integrated circuit of claim 1 wherein said other areas proximate to said particular area are in separate ones of said memory cell layers.

8. The ferroelectric integrated circuit of claim 1 wherein there are an even number of said first and second layer of conducting lines.

9. The ferroelectric integrated circuit of claim 1 wherein there are an odd number of said first and second layer of conducting lines.

10. The ferroelectric integrated circuit of claim 1 wherein there are an even number of said ferroelectric layers.

11. The ferroelectric integrated circuit of claim 1 wherein there are an odd number of said ferroelectric layers.

* * * * *